(12) United States Patent
Lee et al.

(10) Patent No.: US 11,363,718 B2
(45) Date of Patent: Jun. 14, 2022

(54) OSCILLATOR STRUCTURE AND ELECTRONIC DEVICE INCLUDING THE SAME

(71) Applicant: Samsung Electronics Co., Ltd., Gyeonggi-do (KR)

(72) Inventors: Ungryeol Lee, Gyeonggi-do (KR); Youngjin Kim, Gyeonggi-do (KR); Taeyoun Kwon, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/082,657

(22) Filed: Oct. 28, 2020

(65) Prior Publication Data

US 2021/0136918 A1 May 6, 2021

(30) Foreign Application Priority Data

Oct. 30, 2019 (KP) .......................... 10-2019-0136498

(51) Int. Cl.
*H05K 1/18* (2006.01)
*H05K 1/02* (2006.01)
(Continued)

(52) U.S. Cl.
CPC ............. *H05K 1/184* (2013.01); *H03L 1/028* (2013.01); *H05K 1/0215* (2013.01); *H05K 1/111* (2013.01);
(Continued)

(58) Field of Classification Search
CPC ...... H05K 1/184; H05K 1/0215; H05K 1/111; H05K 1/181; H05K 2201/10151;
(Continued)

(56) References Cited

U.S. PATENT DOCUMENTS 5,744,758 A * 4/1998 Takenouchi ...... H01L 23/49827
174/255
6,229,404 B1 * 5/2001 Hatanaka ................. H03B 5/04
257/698
(Continued)

FOREIGN PATENT DOCUMENTS

JP  2006-157858  6/2006
JP  2009-239576  10/2009
(Continued)

OTHER PUBLICATIONS

English Translation JP2006157858 (Year: 2006).*
International Search Report dated Feb. 8, 2021 issued in counterpart application No. PCT/KR2020/014661, 3 pages.

*Primary Examiner* — Steven T Sawyer
(74) *Attorney, Agent, or Firm* — The Farrell Law Firm, P.C.

(57) ABSTRACT

An electronic device and oscillator structure are provided. The electronic device includes a printed circuit board, an oscillator configured to oscillate at a frequency corresponding to an operation clock of the electronic device, and a connection member disposed between the oscillator and the printed circuit board such that the oscillator is spaced apart from a surface of the printed circuit board to electrically connect the oscillator to the printed circuit board. The connection member includes a first pad part electrically connected to a terminal of the oscillator, a second pad part electrically connected to a pad of the printed circuit board, and at least one conductive pattern electrically connecting the first pad part and the second pad part.

20 Claims, 6 Drawing Sheets

(51) Int. Cl.
*H05K 1/11* (2006.01)
*H03L 1/02* (2006.01)

(52) U.S. Cl.
CPC ... *H05K 1/181* (2013.01); *H05K 2201/10075* (2013.01); *H05K 2201/10151* (2013.01)

(58) Field of Classification Search
CPC ... H05K 2201/10075; H05K 2201/049; H05K 1/141; H05K 1/0243; H05K 2201/10378; H05K 2201/10568; H03L 1/028; H03H 9/02023; H03H 9/02102
See application file for complete search history.

(56) References Cited

U.S. PATENT DOCUMENTS

| | | |
|---|---|---|
| 2005/0055814 A1 | 3/2005 | Hatanaka et al. |
| 2005/0056458 A1* | 3/2005 | Sugiura .................. H03B 5/36 174/260 |
| 2009/0174291 A1* | 7/2009 | Nagano ................ H03H 9/1021 310/344 |
| 2011/0114353 A1* | 5/2011 | Iizuka ................ H01L 23/49838 174/50.5 |
| 2012/0112868 A1* | 5/2012 | Wu .......................... H01F 5/003 336/200 |
| 2012/0200366 A1* | 8/2012 | Nishiyama ............... H03H 9/13 331/158 |
| 2015/0162295 A1 | 6/2015 | Tseng et al. |
| 2015/0162521 A1* | 6/2015 | Kojo .................... H03H 9/1021 310/344 |
| 2016/0088735 A1 | 3/2016 | Park et al. |
| 2018/0248516 A1 | 8/2018 | Noto |
| 2018/0337134 A1* | 11/2018 | Mitsukura .......... H01L 21/4853 |
| 2019/0103513 A1* | 4/2019 | Watanabe ............... H01L 33/62 |

FOREIGN PATENT DOCUMENTS

| | | | |
|---|---|---|---|
| JP | 2012-15909 | * 1/2012 | ... H01L 2224/16227 |
| JP | 2013-102315 | 5/2013 | |
| JP | 2018-033062 | 3/2018 | |
| KR | 1020150068302 | 6/2015 | |
| KR | 1020160035492 | 3/2016 | |

* cited by examiner

OSCILLATOR STRUCTURE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0136498, filed on Oct. 30, 2019, in the Korean Intellectual Property Office, the disclosure of which is herein incorporated by reference in its entirety.

BACKGROUND

1. Field

The present disclosure relates generally to an oscillator structure and an electronic device including the oscillator structure.

2. Description of Related Art

An oscillator is an electronic component that oscillates at a frequency corresponding to an operation clock of the electronic device. The oscillator may be a quartz oscillator employing quartz. The quartz oscillator uses a piezoelectric effect of quartz pieces. If an alternating current (AC) voltage is applied to a quartz piece cut in a specific direction with respect to an axis of a quartz crystal, vibration is caused by a deformation force due to a piezoelectric phenomenon. Using this, oscillation at a frequency corresponding to an operation clock of the electronic device may be realized.

The frequency stability and frequency precision of a quartz oscillator are superior to those of other kinds of oscillators.

Oscillators may be very vulnerable to a change in temperature. For example, a frequency may change if the temperature of a quartz piece corresponding to a piezoelectric material of a quartz oscillator changes severely. In order to resolve this, a temperature compensating quartz oscillator that is operated by adding an element capable of measuring temperature to the quartz oscillator to compensate for temperature may be used.

Because the compensation of the temperature has a limit, it may be difficult to compensate for the temperature if the change in temperature is excessive. In particular, a small-sized electronic device that cannot easily emit heat may undergo this phenomenon more frequently.

SUMMARY

The present disclosure has been made to address at least the disadvantages described above and to provide at least the advantages described below.

In accordance with an aspect of the present disclosure, an electronic device is provided. The electronic device includes a printed circuit board, an oscillator configured to oscillate at a frequency corresponding to an operation clock of the electronic device, and a connection member disposed between the oscillator and the printed circuit board such that the oscillator is spaced apart from a surface of the printed circuit board to electrically connect the oscillator to the printed circuit board. The connection member includes a first pad part electrically connected to a terminal of the oscillator, a second pad part electrically connected to a pad of the printed circuit board, and at least one conductive pattern electrically connecting the first pad part and the second pad part.

In accordance with an aspect of the present disclosure, an oscillator structure for oscillating a frequency corresponding to an operation clock of an electronic device is provided. The oscillator structure includes an oscillator comprising an oscillator body, a piezoelectric material installed to vibrate with respect to the oscillator body, and a piezoelectric pad electrically connected to the piezoelectric material to apply a voltage to the piezoelectric material, and a connection member disposed between the oscillator and the printed circuit board such that the oscillator is spaced apart from a surface of the printed circuit board to electrically connect the oscillator to the printed circuit board. The connection member includes a first pad part electrically connected to the piezoelectric pad of the oscillator, a second pad part electrically connected to a pad of the printed circuit board and at least one conductive pattern electrically connecting the first pad part and the second pad part.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
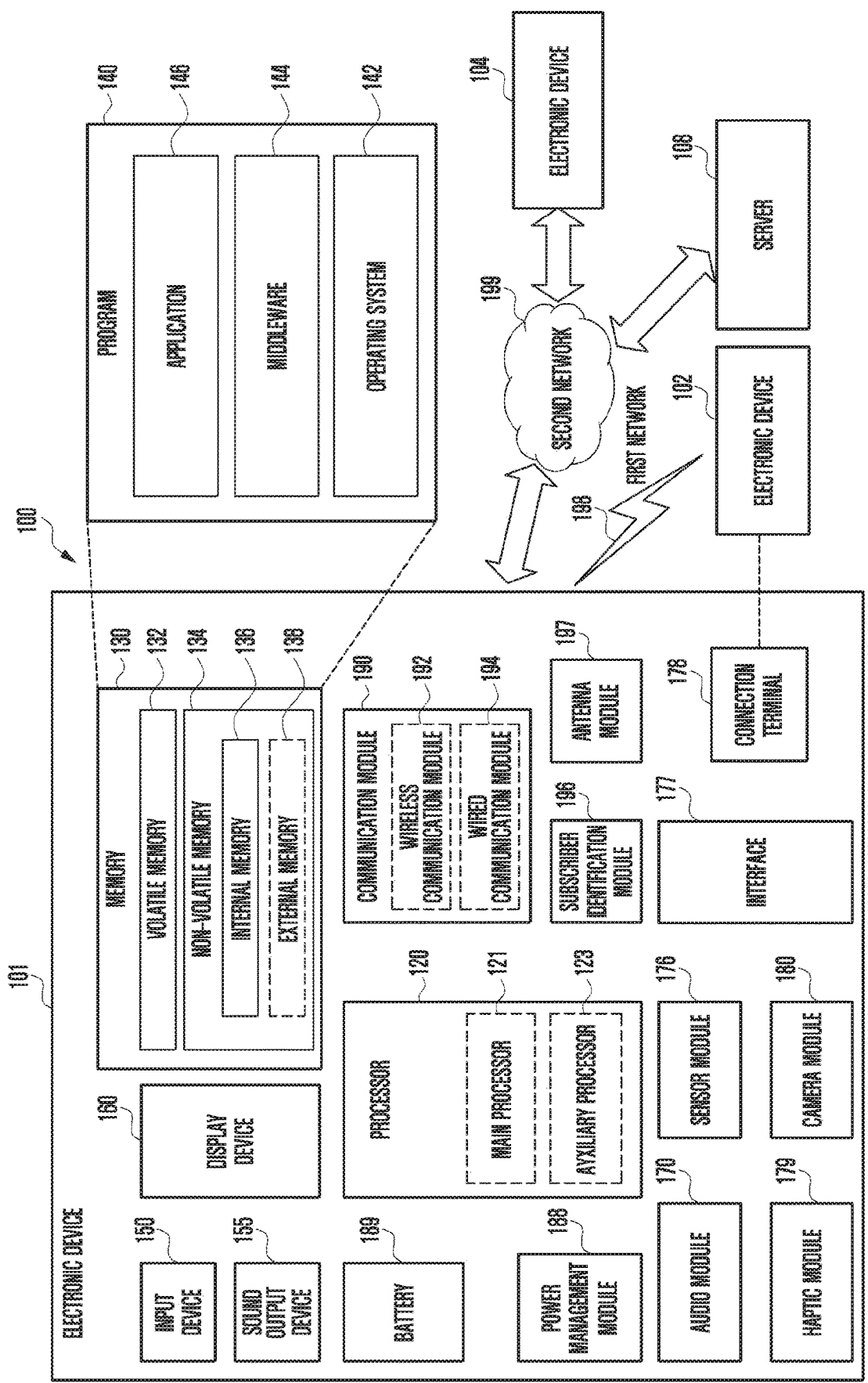
FIG. 1 illustrates a block diagram of an electronic device in a network environment, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
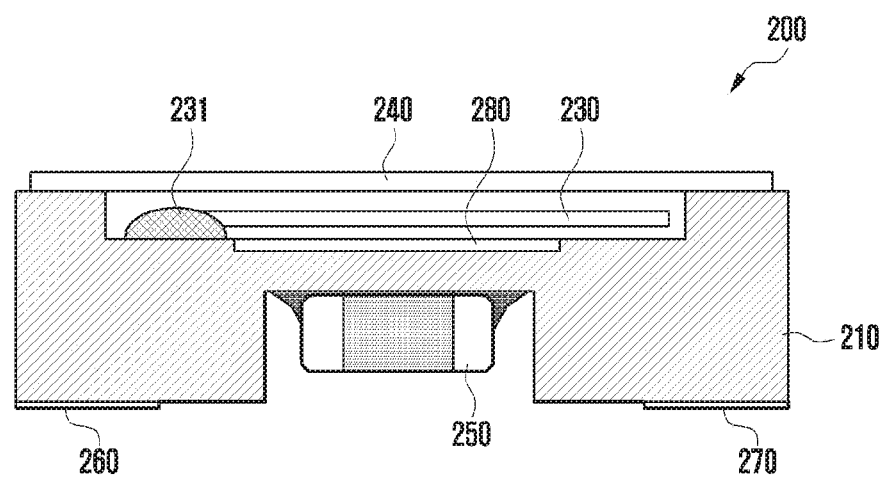
FIG. 2A is a cross-sectional view of an oscillator, according to an embodiment.
Figure 2B:
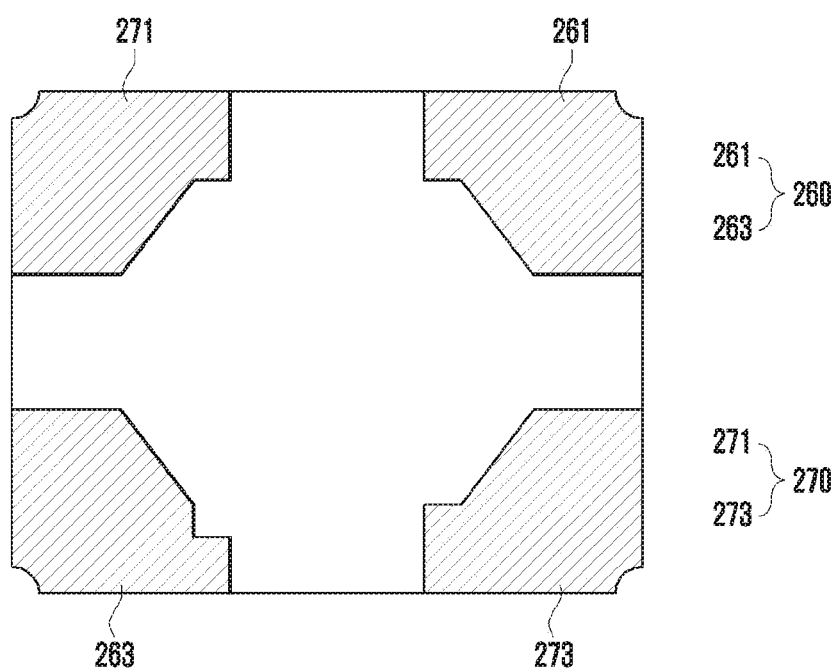
FIG. 2B is a view illustrating a terminal of an oscillator, according to an embodiment.

FIG. 2A is a cross-sectional view of an oscillator 200, according to an embodiment. FIG. 2B is a view illustrating a terminal of an oscillator 200, according to an embodiment.

An oscillator 200 may include an oscillator body 210, a piezoelectric material 230, an oscillator control circuit 280, an oscillation pad 260, a temperature sensor 250, or a temperature pad 270. The oscillator 200 in the form illustrated in FIG. 2A is simply an example of the oscillator 200 included in the oscillator structure 200 disclosed in the disclosure, and the configuration and form of the oscillator 200 may be variously changed. The temperature sensor 250 and the temperature pad 270 may be omitted, or the oscillator control circuit 280 may be omitted. The temperature sensor may be disposed not in the oscillator 200 but in the connection member 350 of FIG. 3A, which will be described below.

The oscillator body 210 may be a base that supports the configurations of the oscillator 200. The oscillator body 210 may be formed of a material having an insulation property. The oscillator body 210 may be formed of a material having high corrosion resistance, high wear resistance, and high mechanical strength. The oscillator body 210 may include aluminum oxide ($Al_2O_3$).

The piezoelectric material 230 may be a material that causes a piezoelectric phenomenon in which crystals are deformed as a voltage is applied or an electromagnetic field is formed. As illustrated in FIG. 2A, the piezoelectric material 230 is configured such that one side thereof is attached to the oscillator body 210 by using a bonding material 231 to vibrate with respect to the oscillator body 210. The bonding material 231 may be an adhesive of a silicon material filled with silver. A distal end of the piezoelectric material 230 may be joined to the oscillator body 210 through soldering. The piezoelectric material 230 may oscillate at a predetermined clock signal through a piezoelectric phenomenon. The piezoelectric material 230 may oscillate at a frequency corresponding to an operation clock of an electronic device. The piezoelectric material 230 may be a crystal such as quartz or polycrystalline ceramics.

The oscillator control circuit 280 may be a circuit that is electrically connected to the piezoelectric material 230 and the temperature sensor 250 and controls an operation of the oscillator 200. The oscillator control circuit 280 may compensate for a change in a frequency of the piezoelectric material 230 according to a change in temperature by adjusting a voltage applied to the piezoelectric material 230 through temperature information measured by the temperature sensor 250.

The temperature sensor 250 may measure the temperature of the piezoelectric material 230. The frequency of the piezoelectric material 230 formed of a crystal may be changed according to a change in temperature. The change in the frequency of the piezoelectric material 230 according to a change in temperature may be compensated for through a compensation operation of changing an electrical signal applied to the piezoelectric pad 260, based on the temperature information measured by the temperature sensor 250. The temperature sensor 250 may include a ceramic material.

A cover 240 may be installed in the piezoelectric body to prevent the piezoelectric material 230 from being exposed to the outside. As illustrated in FIG. 2A, the cover 240 may be disposed to cover the piezoelectric material 230. The cover 240 may be formed of an alloy. The cover 240 may be formed of an alloy including nickel (Ni), kovar (an alloy including iron (Fe), nickel (Ni) or cobalt (Co)), silver (Ag), or copper (Cu).

As illustrated in FIG. 2B, the oscillator 200 may include a plurality of pads 261, 263, 271, and 273 for receiving or transmitting an electrical signal introduced to the oscillator 200. The plurality of pads 261, 263, 271, and 273 may be formed of an alloy. The plurality of pads 261, 263, 271, and 273 may be formed of an alloy including molybdenum (Mo), nickel (Ni), and gold (Au). The plurality of pads 261, 263, 271, and 273 may be electrical terminals corresponding to at least one or more of a ground GND, an output OUT, a temperature sensor, an input IN, and a voltage VDD. The number and function of the plurality of pads may be variously changed.

The plurality of pads 261 and 263 may constitute an oscillation pad 260. The oscillation pad 260 may be a terminal that applies a voltage to the piezoelectric material 230. The piezoelectric material 230 may be connected between the two terminals 261 and 263. If a voltage is applied to the piezoelectric material 230 through the oscillation pad 260, as described above, the piezoelectric material 230 may oscillate at a predetermined clock signal.

Among the plurality of pads 271 and 273, the temperature pad 270 may be electrically connected to the temperature sensor 250. One of the two terminals may be a ground terminal 271, and the other thereof may be a terminal 273 for delivering temperature information in the form of an electrical signal measured by the temperature sensor 250.

The pad 261 may be a terminal that applies a voltage VDD to the oscillator control circuit 280 or the piezoelectric material 230. The pad 263 may be a ground terminal 271. At least one of the two terminals 271 and 273 may be a terminal that outputs a predetermined clock signal generated when a voltage is applied to the piezoelectric material 230.

A heat transfer member having an excellent thermal conductivity may be installed in an electrical terminal (e.g., the pads 261, 263, 271, or 273) corresponding to a path, along which heat is transferred to the piezoelectric material 230. Accordingly, the thermal capacity of the oscillator 200 may increase as a whole, and thus the magnitude of the change in the temperature of the piezoelectric material 230 may decrease.

The width of the electrical terminal corresponding to a path, along which heat is transferred to the piezoelectric material 230 may increase as compared with the form illustrated in FIG. 2A. Accordingly, the thermal capacity of the oscillator 200 may increase as a whole, and thus the magnitude of the change in the temperature of the piezoelectric material 230 may decrease.

Figure 3A:
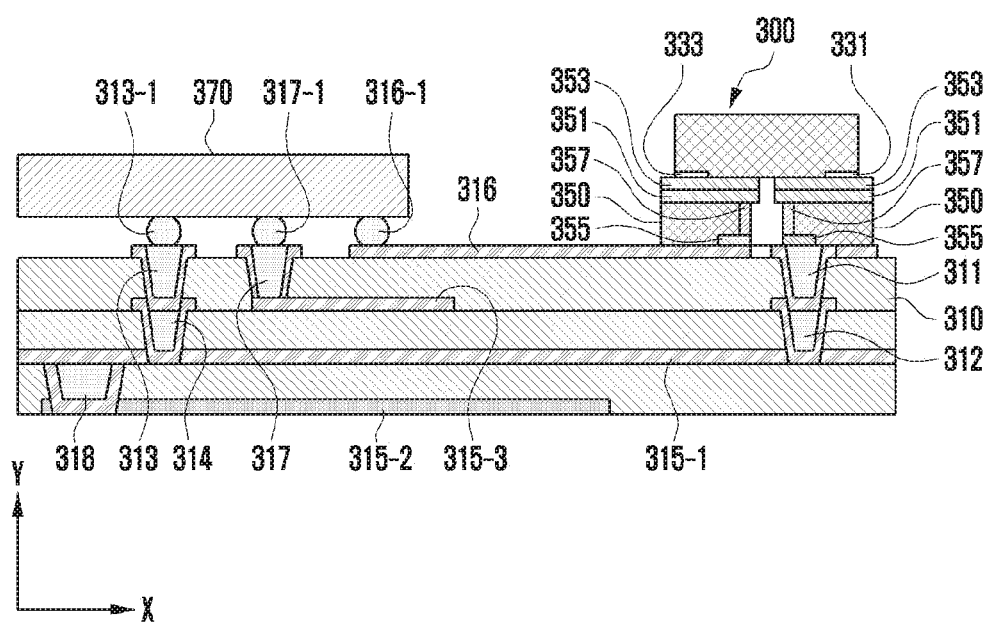
FIG. 3A is a cross-sectional view illustrating a state in which an oscillator structure is disposed in a printed circuit board, according to an embodiment.

FIG. 3A is a cross-sectional view illustrating a state in which an oscillator structure is disposed in a printed circuit board 310, according to an embodiment.

As illustrated in FIG. 3A, the oscillator 300 may be electrically connected to the printed circuit board 310 through a connection member 350. The oscillator 300 may be disposed on the printed circuit board 310 at a location that is spaced apart from a heat source 370 of the electronic device. An example of the heat source 370 may be a processor 120 and a power management module 188. The oscillator 300 may be disposed at a location that is spaced apart from the heat source 370 by about 3 mm to 10 mm in the horizontal direction (e.g., the X direction of FIG. 3A).

The connection member 350 may space the oscillator 300 apart from a surface of the printed circuit board 310. The connection member 350 may space the oscillator 300 in a direction (e.g., the Y direction of FIG. 3A) that is perpendicular to the extension direction (e.g., the X direction of FIG. 3A) of the printed circuit board 310. The connection member 350 may connect the oscillator 300 to the printed circuit board 310.

Referring to FIG. 3A, the connection member 350 may include a first pad part 353, a second pad part 355, and a conductive pattern 357.

The first pad part 353 of the connection member 350 may be formed of a material having a high conductivity. The first pad part 353 may contact a first pad 333 and a second pad 331 to be electrically connected thereto. The first pad part 353 may be attached to the first pad 333 and the second pad 331 by soldering.

The first pad part 353 may include a reinforcing pad 351. The reinforcing pad 351 may be formed of a material having a high conductivity like the first pad part 353.

FIG. 3A illustrates that the first pad part 353 and the reinforcing pad 351 are divided, but the reinforcing pad 351 may be integrally formed with the first pad part 353. The first pad part 353 and the reinforcing pad 351 may be formed of the same material. The area and the volume of the first pad 352 may increase. The heat generated by the heat source 370 of the electronic device may be transferred to the oscillator 300 through the first pad part 353. Due to the reinforcing pad 351 included in the first pad part 353, the thermal capacity of the oscillator structure may increase as a whole. Accordingly, the magnitude of the change in temperature of the piezoelectric material of the oscillator structure may decrease.

The second pad part 355 of the connection member 350 may be formed of a material having a high conductivity. The second pad part 355 may contact an introduction line 316 connected to the heat source 370 or a first via hole 311 of the printed circuit board 310 to be electrically connected thereto. The second pad part 355 may be attached to the first via hole 311 of the printed circuit board 310 by soldering. The heat source 370 may be electrically connected to the introduction line 316 through a solder ball 316-1. When the heat source is the power management module 188 illustrated in FIG. 1, it may be connected to a ground or be supplied with electric power through the second pad part 355 that electrically contacts the introduction line 316.

A first ground line 315-1 of the printed circuit board 310 may be disposed in the interior of the printed circuit board 310. The first via hole 311 and the second via hole 312 of the printed circuit board 310 may be disposed in the interior of the printed circuit board 310 along the Y direction with reference to FIG. 3A. As illustrated in FIG. 3A, the second via hole 312 may contact the first ground line 315-1, and the first via hole 311 and the second via hole 312 may contact each other. The first ground line 315-1, the second via hole 312, the first via hole 311, and the second pad part 355 may be connected in that sequence, and the first ground line 315-1 and the second pad part 355 may be connected to each other. In this way, the first ground line 315-1 may be disposed in the interior of the printed circuit board 310 such that the first ground line 315-1 and the oscillator 300 are physically spaced apart from each other, and thus the heat of the first ground line 315-1 may be prevented from being easily transferred to the oscillator 300.

The third via hole 313 and the fourth via hole 314 of the printed circuit board 310 may be disposed in the interior of the printed circuit board 310 along the Y direction with reference to FIG. 3A. As illustrated in FIG. 3A, the fourth via hole 314 may contact the first ground line 315-1, and the third via hole 313 and the fourth via hole 314 may contact each other. The first ground line 315-1, the fourth via hole 314, the third via hole 313, and the ground terminal of the heat source 370 may be connected in that sequence, and the first ground line 315-1 and the heat source 370 may be connected to each other. The third via hole 313 and the heat source 370 may be electrically connected to each other through a solder ball 313-1.

A line 315-3 may be disposed on the upper side (e.g., the Y direction of FIG. 3B) of the first ground line 315-1. The line 315-3 may be a wiring line that delivers an electrical signal or electric power. The heat source 370 may be electrically connected to the line 315-3 through a fourth via hole 317. The heat source 370 may be electrically connected to the fourth via hole 317 through a solder ball 317-1. The heat source 370 may receive or provide electric power through the line 315-3 and receive or transmit a control signal.

The second ground line 315-2 may be disposed on the lower side of the first ground line 315-1. The first ground line 315-1 and the second ground line 315-2 may be electrically connected to each other through a sixth via hole 318.

The second pad part 355 may correspond to the first pad part 353. If a total of fourth first pads 353 are provided, the second pad part 355 may also include four pads in the same way. The second pad part 355 may be disposed to be spaced apart from the first pad part 353. The first pad part 353 and the second pad part 355 may be spaced apart from each other in the Y direction of FIG. 2A. As described above, the first pad part 353 may contact the oscillator 300 and the second pad part 355 may contact the printed circuit board 310. Because the first pad part 353 and the second pad part 355 may be disposed to be spaced apart from each other in the Y direction of FIG. 2A, the oscillator 300 and the printed circuit board 310 may also be disposed to be spaced apart from each other in the Y direction of FIG. 2A. The spacing distance between the first pad part 353 and the second pad part 355 may be variously set. The height of the connection member 350 may be determined according to the spacing distance between the first pad part 353 and the second pad part 355.

The conductive pattern 357 may be disposed in the interior of the connection member 350. The conductive pattern 357 may be formed of a conductive material. The conductive pattern 357 may electrically connect the first pad part 353 and the second pad part 355. The conductive pattern 357 may connect the first pad part 353 and the second pad part 355 in the interior of the connection member 350 in various forms of patterns. The conductive pattern 357 may be disposed in the interior of the connection member 350 such that the first pad part 353 and the second pad part 355, which are spaced apart from each other in the Y direction of FIG. 2A, are connected to each other.

Figure 3B:
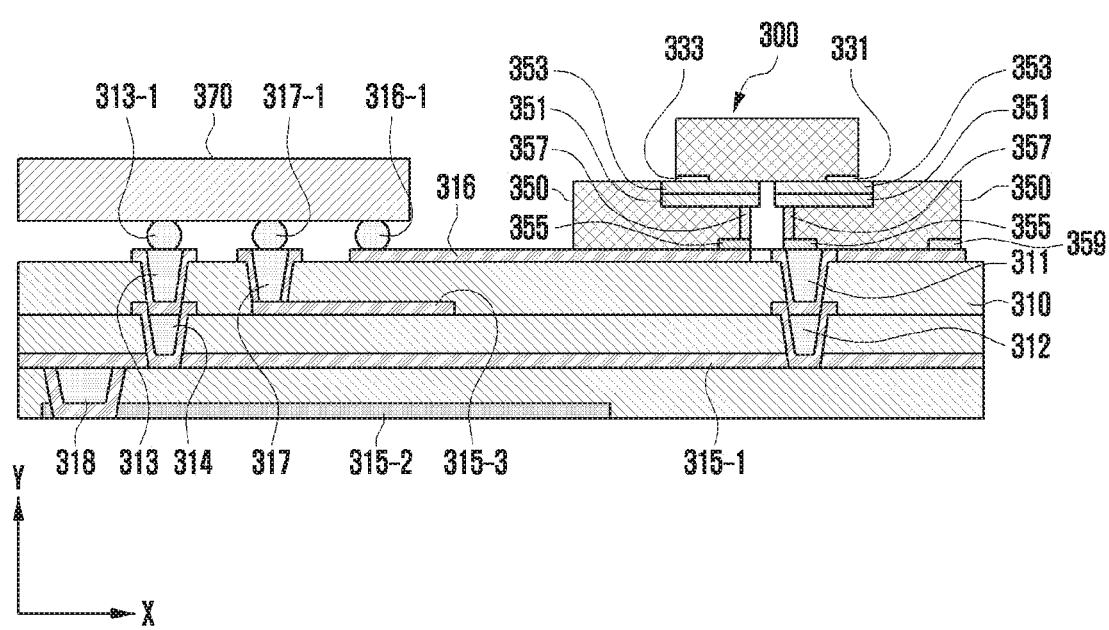
FIG. 3B is a cross-sectional view illustrating a state in which an oscillator structure is disposed in a printed circuit board, according to an embodiment.

FIG. 3B is a cross-sectional view illustrating a state in which an oscillator structure is disposed in a printed circuit board 310, according to an embodiment.

Because the oscillator structure illustrated in FIG. 3B is similar to the oscillator structure illustrated in FIG. 3A, the same configurations are referred to by the same reference numbers and detailed descriptions thereof will be omitted.

Referring to FIG. 3B, the connection member 350 of the oscillator structure may include a first pad part 353, a second pad part 355, and a conductive pattern 357 that electrically connects the first pad part 353 and the second pad part 355, and may further include an auxiliary pad 359.

The auxiliary pad 359 may be mounted on the printed circuit board 310. The auxiliary pad 359 may be attached to the printed circuit board 310 through soldering. The auxiliary pad 359 may be disposed in at least a partial area along a periphery. The auxiliary pad 359 may increase the structural stability of the oscillator structure by reinforcing the coupling force of the connection member 350 and the printed circuit board 310.

Figure 4:
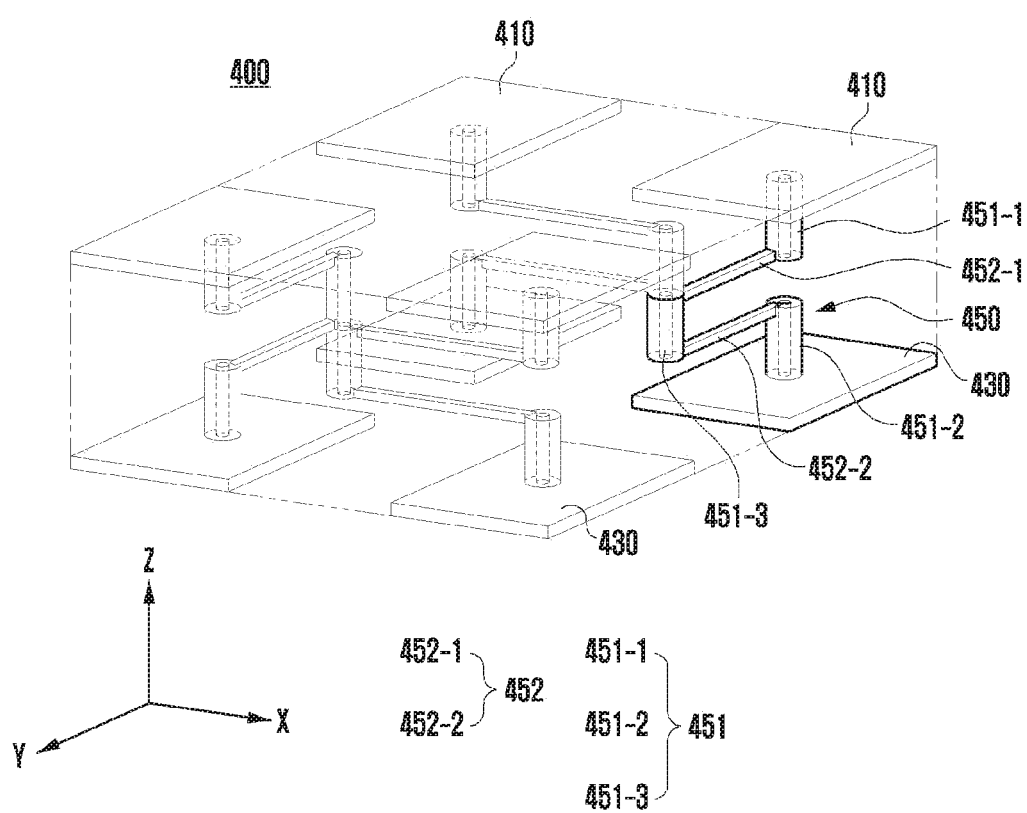
FIG. 4 is a view illustrating a conductive pattern of a connection member, according to an embodiment.

FIG. 4 is a view illustrating a conductive pattern 450 of a connection member 400, according to an embodiment.

As described above, a conductive pattern 450 of a connection member 400 may have various patterns for electrically connecting a first pad part 410 and a second pad part 430 of the connection member 400. FIG. 4 illustrates one example of the conductive pattern 450.

Referring to FIG. 4, the conductive pattern 450 may include a vertical connector 451 and a horizontal connector 452. The vertical connector 451 may refer to a conductive pattern disposed in a direction (e.g., the Z direction of FIG. 4) that is perpendicular to an extension direction of the printed circuit board 310 of the electronic device, to which the connection member 400 is attached. The horizontal connector 452 may refer to a conductive pattern disposed in a direction (e.g., the X direction or the Y direction of FIG. 4) that is perpendicular to the vertical connector 451.

Each of the first pad part 410 and the second pad part 430 may include four conductive pads. Hereinafter, the conductive pattern 450 will be described with reference to connection of one of the first pad part 410 and one of the second pad part 430.

The horizontal connector 452 may include a first horizontal connector 452-1 and a second horizontal connector 452-2. The first horizontal connector 452-1 may be a horizontal connector 452 that is close to the first pad part 410, and the second horizontal connector 452-2 may be a horizontal connector 452 that is close to the second pad part 430. The vertical connector 451 may include a first vertical connector 451-1, a second vertical connector 451-2, and a third vertical connector 451-3. The first vertical connector 451-1 may be a vertical connector 451 that is directly connected to the first pad part 410, and the second vertical connector 451-2 may be a vertical connector 451 that is directly connected to the second pad part 430. The third vertical connector 451-3 may be a vertical connector 451 that connects the first horizontal connector 452-1 and the second horizontal connector 452-2. An electrical signal introduced to the first pad part 410 may be connected to the second pad part 430 via the first vertical connector 451-1, the first horizontal connector 452-1, the third vertical connector 451-3, the second horizontal connector 452-2, and the second vertical connector 451-2 in that sequence. In this way, the conductive pattern 450 may be the first pad part 410 and the second pad part 430 that are spaced apart from each other.

The widths of the horizontal connector 452 and the vertical connector 451 may be variously changed. The width of the horizontal connector 452 may be smaller than the width of the vertical connector 451. The amount of introduced heat that is transferred from a heat source 370 through the second pad part 430 can be reduced by making the width of the horizontal connector 452 small. The widths of the first vertical connector 451-1, the second vertical connector 451-2, and the third vertical connector 451-3 of the vertical connector 451 may be variously changed. The width of the second vertical connector 451-2 may be made largest, and the width of the first vertical connector 451-1 may be made smallest. The width of the first vertical connector 451-1 may be made largest, and the width of the second vertical connector 451-2 may be made smallest.

The area and the volume of the first pad part 410 of the connector member 350 may be made larger than the area and the volume of the pads 331 and 333 of the oscillator 200.

The conductive pattern 450 of the connection member 350 may include the vertical connector 451 and the horizontal connector 452, but it may not include the horizontal connectors 452 of the first pad part 410 and the second pad part 430 electrically connected to the introduction line 316, or the horizontal connectors 452 may be made shorter than those of the other patterns.

According to an embodiment, an electronic device may include a printed circuit board, an oscillator configured to oscillate at a frequency corresponding to an operation clock of the electronic device, and a connection member disposed between the oscillator and the printed circuit board such that the oscillator is spaced apart from a surface of the printed circuit board to electrically connect the oscillator to the printed circuit board. The connection member may include a first pad part electrically connected to a terminal of the oscillator, a second pad part electrically connected to a pad of the printed circuit board, and at least one conductive pattern electrically connecting the first pad part and the second pad part.

The at least one conductive pattern of the connection member may include at least one vertical connector disposed in a direction that is perpendicular to an extension direction of the printed circuit board.

The at least one conductive pattern of the connection member may include at least one horizontal connector disposed in a direction that is parallel to an extension direction of the printed circuit board.

The at least one conductive pattern of the connection member may be configured such that the at least one horizontal connector includes a first horizontal connector and a second horizontal connector, and the at least one vertical connector includes a first vertical connector connecting the first pad part of the connection member and the first horizontal connector, a second vertical connector connecting the second pad part of the connection member and the second horizontal connector, and a third vertical connector connecting the first horizontal connector and the second horizontal connector.

The oscillator may include an oscillator body, a piezoelectric material installed to vibrate with respect to the oscillator body, and a piezoelectric pad electrically connected to the piezoelectric material to apply a voltage to the piezoelectric material, and the first pad part of the connection member may contact the piezoelectric pad of the oscillator.

The oscillator may further include a temperature sensor installed in the oscillator body to measure the temperature of the piezoelectric material, and a temperature pad electrically connected to the temperature sensor. The first pad part of the connection member may contact the piezoelectric pad and the temperature pad of the oscillator.

The piezoelectric material of the oscillator may be quartz.

The connection member may further include an auxiliary pad mounted on the printed circuit board.

The connection member may be configured such that the width thereof is larger than the width of the oscillator.

The first pad part of the connection member may further include a reinforcing pad to increase the thickness of the first pad part.

A ground line may be disposed in the interior of the printed circuit board, and the ground line and the second pad part of the connection member may be electrically connected through a via hole disposed in the interior of the printed circuit board in a direction that is perpendicular to an extension direction of the printed circuit board such that the ground line and the oscillator are physically spaced apart from each other.

According to an embodiment, an oscillator structure for oscillating a frequency corresponding to an operation clock of an electronic device may include an oscillator including an oscillator body, a piezoelectric material installed to vibrate with respect to the oscillator body, and a piezoelectric pad electrically connected to the piezoelectric material to apply a voltage to the piezoelectric material, and a connection member disposed between the oscillator and the printed circuit board such that the oscillator is spaced apart from a surface of the printed circuit board to electrically connect the oscillator to the printed circuit board. The connection member may include a first pad part electrically connected to the piezoelectric pad of the oscillator, a second pad part electrically connected to a pad of the printed circuit board, and at least one conductive pattern electrically connecting the first pad part and the second pad part.

The at least one conductive pattern of the connection member may include at least one vertical connector disposed in a direction that is perpendicular to an extension direction of the printed circuit board.

The at least one conductive pattern of the connection member may include at least one horizontal connector disposed in a direction that is parallel to an extension direction of the printed circuit board.

The at least one conductive pattern of the connection member may be configured such that the at least one horizontal connector includes a first horizontal connector and a second horizontal connector, and the at least one vertical connector includes a first vertical connector connecting the first pad part of the connection member and the first horizontal connector, a second vertical connector connecting the second pad part of the connection member and the second horizontal connector, and a third vertical connector connecting the first horizontal connector and the second horizontal connector.

The oscillator structure may further include a temperature sensor installed in the oscillator body to measure the temperature of the piezoelectric material, and a temperature pad electrically connected to the temperature sensor. The first pad part of the connection member may contact the temperature pad.

The piezoelectric material may be quartz.

The connection member may further include an auxiliary pad mounted on the printed circuit board.

The connection member may be configured such that the width thereof is larger than the width of the oscillator.

The first pad part of the connection member may further include a reinforcing pad to increase the thickness of the first pad part.

While the disclosure has been shown and described with reference to certain embodiments thereof, it will be understood by those skilled in the art that various changes in form and details may be made therein without departing from the scope of the disclosure. Therefore, the scope of the disclo-

What is claimed is:

1. An electronic device comprising:
a printed circuit board;
an oscillator configured to oscillate at a frequency corresponding to an operation clock of the electronic device; and
a connection member disposed between the oscillator and the printed circuit board such that the oscillator is spaced apart from a surface of the printed circuit board to electrically connect the oscillator to the printed circuit board,
wherein the connection member comprises:
a first pad part electrically connected to a terminal of the oscillator;
a second pad part directly electrically connected to a pad of the printed circuit board by contacting a first via hole of the printed circuit board; and
at least one conductive pattern electrically connecting the first pad part and the second pad part.

2. The electronic device of claim 1, wherein the at least one conductive pattern of the connection member comprises:
at least one vertical connector disposed in a direction that is perpendicular to an extension direction of the printed circuit board.

3. The electronic device of claim 2, wherein the at least one conductive pattern of the connection member comprises:
at least one horizontal connector disposed in a direction that is parallel to an extension direction of the printed circuit board.

4. The electronic device of claim 3, wherein the at least one conductive pattern of the connection member is configured such that:
the at least one horizontal connector comprises a first horizontal connector and a second horizontal connector; and
the at least one vertical connector comprises:
a first vertical connector connecting the first pad part of the connection member and the first horizontal connector,
a second vertical connector connecting the second pad part of the connection member and the second horizontal connector; and
a third vertical connector connecting the first horizontal connector and the second horizontal connector.

5. The electronic device of claim 1, wherein the oscillator comprises:
an oscillator body;
a piezoelectric material installed to vibrate with respect to the oscillator body; and
a piezoelectric pad electrically connected to the piezoelectric material to apply a voltage to the piezoelectric material, and
wherein the first pad part of the connection member contacts the piezoelectric pad of the oscillator.

6. The electronic device of claim 5, wherein the oscillator further comprises:
a temperature sensor installed in the oscillator body to measure a temperature of the piezoelectric material; and
a temperature pad electrically connected to the temperature sensor,
wherein the first pad part of the connection member contacts the piezoelectric pad and the temperature pad of the oscillator.

7. The electronic device of claim 1, wherein the piezoelectric material of the oscillator is quartz.

8. The electronic device of claim 1, wherein the connection member further comprises:
an auxiliary pad mounted on the printed circuit board.

9. The electronic device of claim 1, wherein the connection member is configured such that a width thereof is larger than a width of the oscillator.

10. The electronic device of claim 1, wherein the first pad part of the connection member further comprises:
a reinforcing pad to increase a thickness of the first pad part.

11. The electronic device of claim 1, wherein a ground line is disposed in an interior of the printed circuit board, and
wherein the ground line and the second pad part of the connection member are electrically connected through a via hole disposed in the interior of the printed circuit board in a direction that is perpendicular to an extension direction of the printed circuit board such that the ground line and the oscillator are physically spaced apart from each other.

12. An oscillator structure for oscillating a frequency corresponding to an operation clock of an electronic device, the oscillator structure comprising:
an oscillator comprising an oscillator body, a piezoelectric material installed to vibrate with respect to the oscillator body, and a piezoelectric pad electrically connected to the piezoelectric material to apply a voltage to the piezoelectric material; and
a connection member disposed between the oscillator and a printed circuit board such that the oscillator is spaced apart from a surface of the printed circuit board to electrically connect the oscillator to the printed circuit board,
wherein the connection member comprises:
a first pad part electrically connected to the piezoelectric pad of the oscillator;
a second pad part directly electrically connected to a pad of the printed circuit board by contacting a first via hole of the printed circuit board; and
at least one conductive pattern electrically connecting the first pad part and the second pad part.

13. The oscillator structure of claim 12, wherein the at least one conductive pattern of the connection member comprises:
at least one vertical connector disposed in a direction that is perpendicular to an extension direction of the printed circuit board.

14. The oscillator structure of claim 13, wherein the at least one conductive pattern of the connection member comprises:
at least one horizontal connector disposed in a direction that is parallel to an extension direction of the printed circuit board.

15. The oscillator structure of claim 14, wherein the at least one conductive pattern of the connection member is configured such that:
the at least one horizontal connector comprises a first horizontal connector and a second horizontal connector; and
the at least one vertical connector comprises:
a first vertical connector connecting the first pad part of the connection member and the first horizontal connector, a second vertical connector connecting the second pad part of the connection member and the second horizontal connector, and a third vertical connector connecting the first horizontal connector and the second horizontal connector.

16. The oscillator structure of claim 12, wherein the oscillator structure further comprises:

a temperature sensor installed in the oscillator body to measure a temperature of the piezoelectric material; and a temperature pad electrically connected to the temperature sensor, and wherein the first pad part of the connection member contacts the temperature pad.

17. The oscillator structure of claim 12, wherein the piezoelectric material is quartz.

18. The oscillator structure of claim 12, wherein the connection member further comprises:

an auxiliary pad mounted on the printed circuit board.

19. The oscillator structure of claim 12, wherein the connection member is configured such that a width thereof is larger than a width of the oscillator.

20. The oscillator structure of claim 12, wherein the first pad part of the connection member further comprises:

a reinforcing pad to increase a thickness of the first pad part.

* * * * *